US012636958B2

(12) United States Patent
Nie et al.

(10) Patent No.: US 12,636,958 B2
(45) Date of Patent: May 26, 2026

(54) PULSE WIDTH MODIFICATION TO PRECLUDE PHASE COINCIDENTAL SWITCHING

(71) Applicant: FORD GLOBAL TECHNOLOGIES, LLC, Dearborn, MI (US)

(72) Inventors: Yue Nie, Ann Arbor, MI (US); Christopher Wolf, Ann Arbor, MI (US); Michael W. Degner, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 433 days.

(21) Appl. No.: 18/052,948

(22) Filed: Nov. 7, 2022

(65) Prior Publication Data
US 2024/0149700 A1 May 9, 2024

(51) Int. Cl.
*H02M 1/08* (2006.01)
*B60L 15/02* (2006.01)
*H03K 3/017* (2006.01)

(52) U.S. Cl.
CPC .............. *B60L 15/02* (2013.01); *H02M 1/08* (2013.01); *H03K 3/017* (2013.01)

(58) Field of Classification Search
CPC ........................... H02M 1/44; H02M 7/53876
See application file for complete search history.

(56) References Cited

U.S. PATENT DOCUMENTS

| | | | | |
|---|---|---|---|---|
| 6,005,783 A * | 12/1999 | Xue | .................... | H02M 7/5395 363/36 |
| 6,088,246 A * | 7/2000 | Okuyama | ......... | H02M 7/53873 363/41 |
| 6,337,625 B1 * | 1/2002 | Taylor | .................... | G01S 13/04 340/552 |
| 6,600,669 B2 * | 7/2003 | Trzynadlowski | ... | H02M 7/5395 363/41 |
| 6,775,157 B2 * | 8/2004 | Honda | .................... | H02M 1/44 363/39 |
| 7,405,528 B2 * | 7/2008 | Ho | ........................ | H02M 5/458 327/381 |
| 9,270,159 B2 * | 2/2016 | Shen | ....................... | H02M 1/12 |
| 9,985,566 B2 * | 5/2018 | Jiang | .................... | H02M 7/493 |
| 10,243,500 B2 | 3/2019 | David et al. | | |
| 12,184,160 B2 * | 12/2024 | Qin | .................... | H02M 7/5395 |

(Continued)

FOREIGN PATENT DOCUMENTS

| | | |
|---|---|---|
| EP | 3942662 A0 | 10/2020 |
| GB | 2505189 A | 2/2014 |
| WO | 2020193466 A1 | 10/2020 |

*Primary Examiner* — Crystal L Hammond
*Assistant Examiner* — Nusrat Quddus
(74) *Attorney, Agent, or Firm* — David B. Kelley; Brooks Kushman P.C.

(57) ABSTRACT
A controller, while parameters are indicative of electromagnetic interference exceeding a predetermined value, generates voltage reference vectors or duty cycle commands such that differences between switching times of any two phases of an inverter are always greater than a threshold, and while the parameters are indicative of the electromagnetic interference being less than the predetermined value, generates the voltage reference vectors or duty cycle commands such that the differences are sometimes greater than the threshold and other times less than the threshold.

6 Claims, 10 Drawing Sheets

(56)  References Cited

U.S. PATENT DOCUMENTS

| | | | | |
|---|---|---|---|---|
| 2002/0089864 A1* | 7/2002 | Kalman | .............. | H02M 5/4585 |
| | | | | 363/34 |
| 2011/0299308 A1* | 12/2011 | Cheng | ................ | H02M 5/4585 |
| | | | | 363/37 |
| 2014/0266488 A1 | 9/2014 | Bors | | |
| 2018/0356140 A1 | 12/2018 | Subramaniam | | |
| 2019/0047614 A1* | 2/2019 | Kashima | ................ | H02P 25/03 |
| 2019/0131868 A1* | 5/2019 | Wang | ............... | H02M 7/53875 |
| 2020/0021227 A1* | 1/2020 | Lee | ....................... | H02P 27/085 |
| 2025/0038695 A1* | 1/2025 | Liu | ......................... | H02P 27/08 |

* cited by examiner

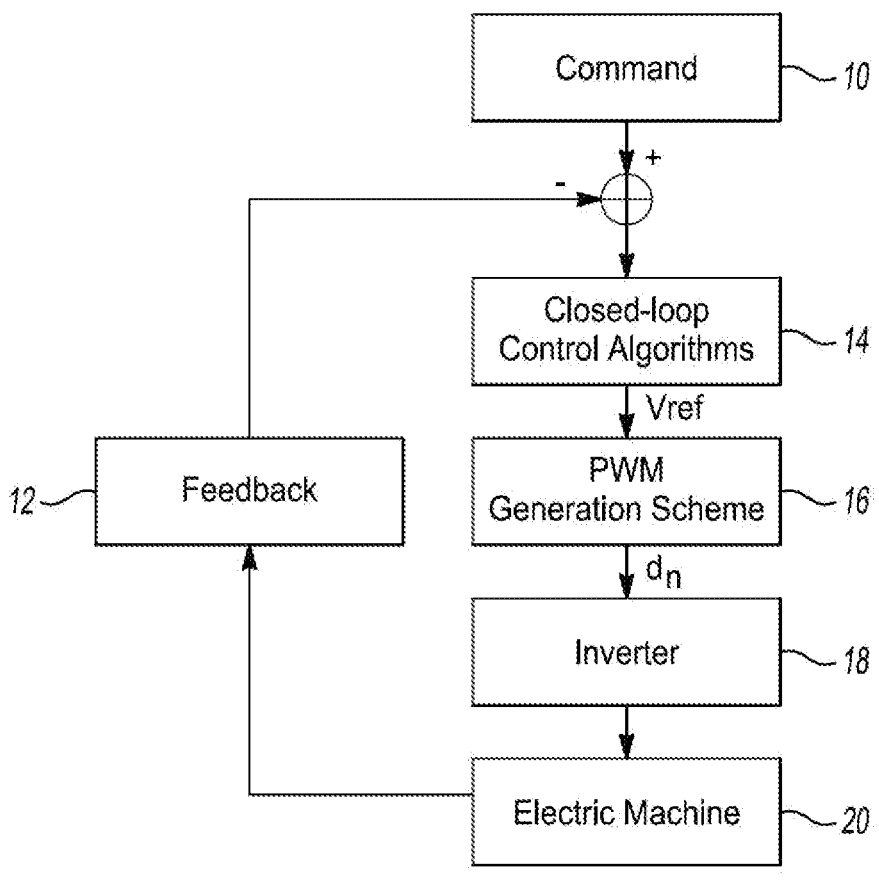
_Fig-1_

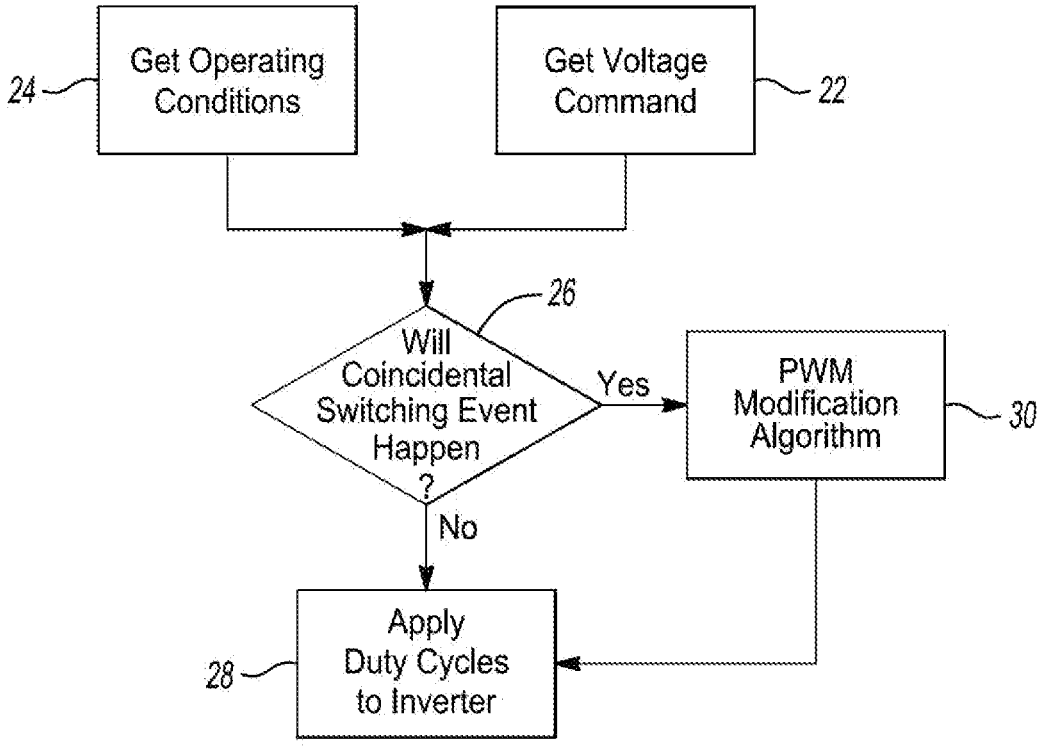
_Fig-8_

PULSE WIDTH MODIFICATION TO PRECLUDE PHASE COINCIDENTAL SWITCHING

TECHNICAL FIELD

This disclosure relates to vehicle power systems and the control thereof.

BACKGROUND

Certain vehicles may be propelled by electric machines that convert electrical energy to mechanical energy.

SUMMARY

A powertrain system has an inverter including switches defining phases, and one or more controllers that, while parameters are indicative of electromagnetic interference exceeding a predetermined value, generate voltage reference vectors or duty cycle commands such that differences between switching times of any two of the phases are always greater than a threshold.

A method includes while parameters are indicative of electromagnetic interference exceeding a predetermined value, generating voltage reference vectors such that differences between switching times that result from the voltage reference vectors of any two phases of an inverter are always greater than a threshold, and while the parameters are indicative of the electromagnetic interference being less than the predetermined value, generating the voltage reference vectors such that the differences are sometimes greater than the threshold and other times less than the threshold.

A vehicle includes an electric machine, an inverter electrically connected with the electric machine, and one or more controllers. The one or more controllers, during presence of traffic, generate voltage reference vectors such that differences between switching times of any two phases of the inverter are always greater than a threshold, and during absence of traffic, generate the voltage reference vectors such that the differences are sometimes greater than the threshold and other times less than the threshold.

BRIEF DESCRIPTION OF THE DRAWINGS

In the following detailed description, reference is made to the accompanying figures, which form a part thereof, and in which are shown by way of illustration specific embodiments. Other embodiments, of course, are also contemplated and/or described.

FIG. 1 is a block diagram of a powertrain system.

FIG. 8 is a flow chart of an algorithm for precluding phase coincidental switching events.

DETAILED DESCRIPTION

Figure 3:
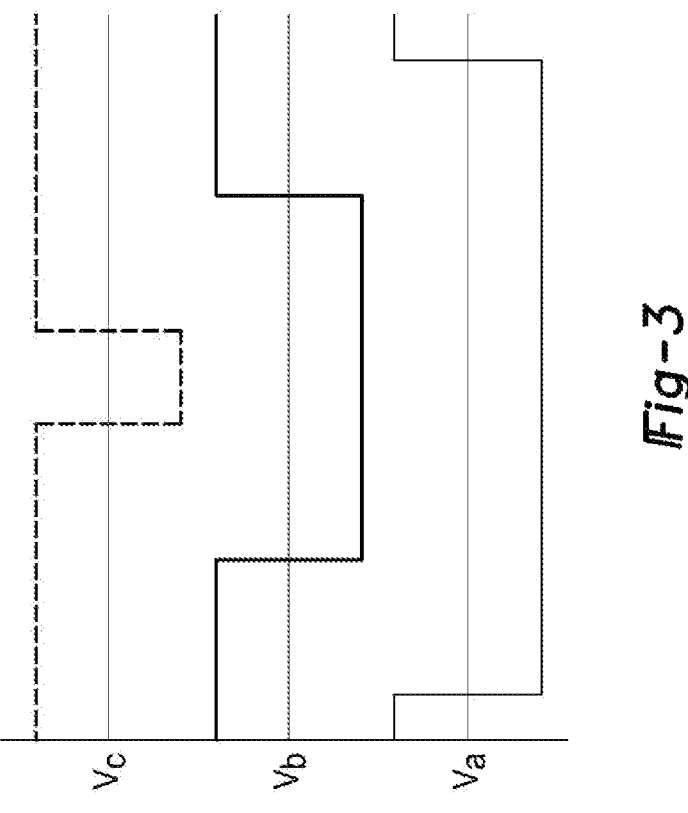
FIG. 3 illustrates traces of the resulting sequence of realizable voltage vectors from FIG. 1, shown as phase voltages.

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The inverter can be a core component in an electrified powertrain that converts DC electricity to AC electricity through pulse width modulation (PWM) of power semiconductor switches. The three phase PWM duty cycles can be generated with multiple known PWM algorithms, such as space vector PWM, sinusoidal PWM, or discontinuous PWM. During the course of normal operation, the modulation scheme may result in the coincidental switching of multiple power electronics within some temporal threshold. These coincidental (or nearly coincidental) switching events can lead to electromagnetic compatibility (EMC) challenges.

Here, we propose a PWM scheme modification that precludes coincidental switching events between phases with minimal effects on the electric powertrain torque and efficiency performance. This process works by first identifying coincidental switching events, calculating a switching adjustment designed to minimize disruption of certain electric drive behaviors and characteristics, and applying this adjustment to the inverter's switching behavior. The following explains these operations in more detail.

Some forms should be compatible with existing PWM algorithms and switching frequency patterns. Additionally, it should be able to tolerate system nonidealities, such as inverter phase leg pause time between upper and lower switches, computational delays, and semiconductor on and off switching dynamics. It should also minimize negative effects on the electric machine torque, efficiency, or the operating range. Finally, implementation of the proposed technology can be dependent on both internal and external circumstances so as to provide the most benefit with the smallest effect on vehicle behavior.

The behavior of coincidental switching will be described, followed by a discussion of methods to alter the switching behavior to preclude coincidental switching. Finally, implementation options to minimize certain effects will be shown.

To control an inverter, a reference voltage vector (Vref) is generated from known control algorithms to be applied in the next sample period. The control algorithms can be a closed-loop control method as in FIG. 1 that generates Vref as a function of both commands and feedback measurements. Commands 10 and feedback 12 are provided to closed-loop control algorithms 14 that generate voltage reference commands, Vref. These voltage reference commands are provided to pulse width modulation schemes 16 to generate duty cycles, dn. The duty cycles are provided to phases of the inverter 18, which then provide power to the electric machine 20. The control algorithms can also be an open-loop control method that generates Vref only as a function of the commands (and not any feedback). In both methods, a known PWM generation method is required to transform Vref into the set of duty cycles, dn. These duty cycles will control the modulation of the power semiconductors such that the inverter 18 will produce the desired voltage Vref on an averaged basis as known in the art.

Figure 2:
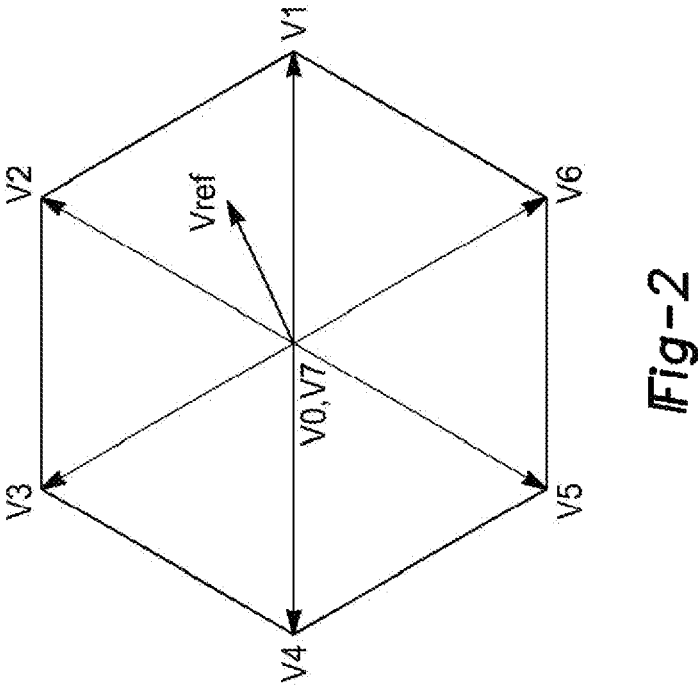
FIG. 2 is a reference voltage vector example.

The voltage reference vector is not directly achievable but is instead decomposed into a sequence of realizable voltage vectors (six active switching vectors V1~V6 and two zero vectors V0, V7) as shown in FIG. 2 such that the average voltage (over the switching period) matches the reference voltage vector. The specific decomposition of the reference voltage into the realizable voltage vector sequence is dependent on the chosen PWM scheme. One such decomposition is shown in FIG. 3 using center-aligned space vector modulation.

Figure 5:
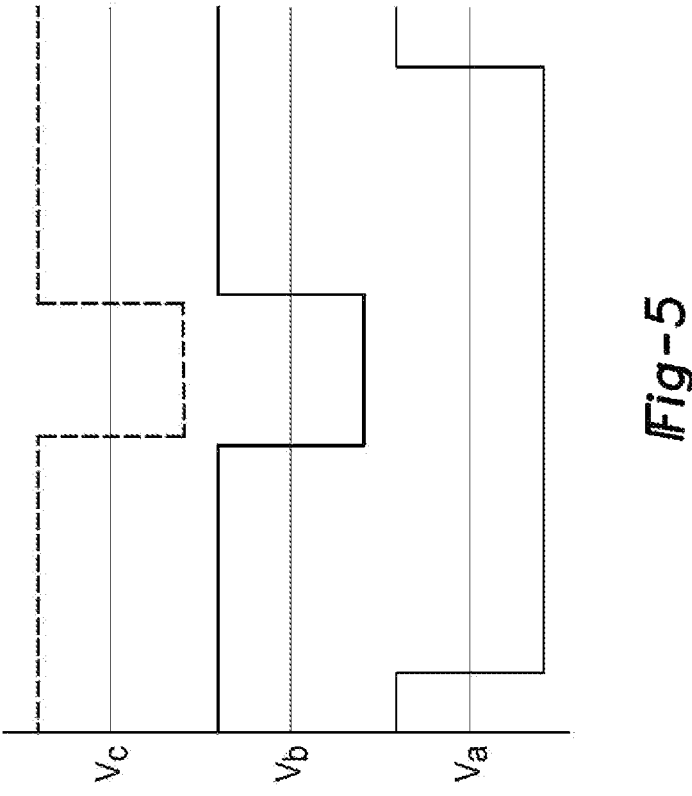
FIG. 5 illustrates traces of the resulting sequence of realizable voltage vectors from FIG. 4, shown as phase voltages. Phases b and c have coincidental transitions that may lead to electromagnetic compatibility challenges.
Figure 4:
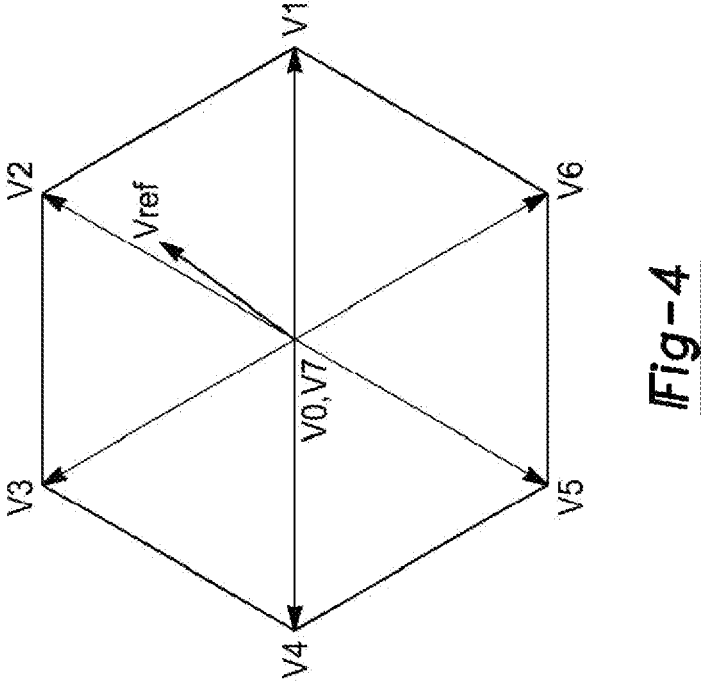
FIG. 4 is a reference voltage vector near one of the realizable voltage vectors.
Figures 6, 7:
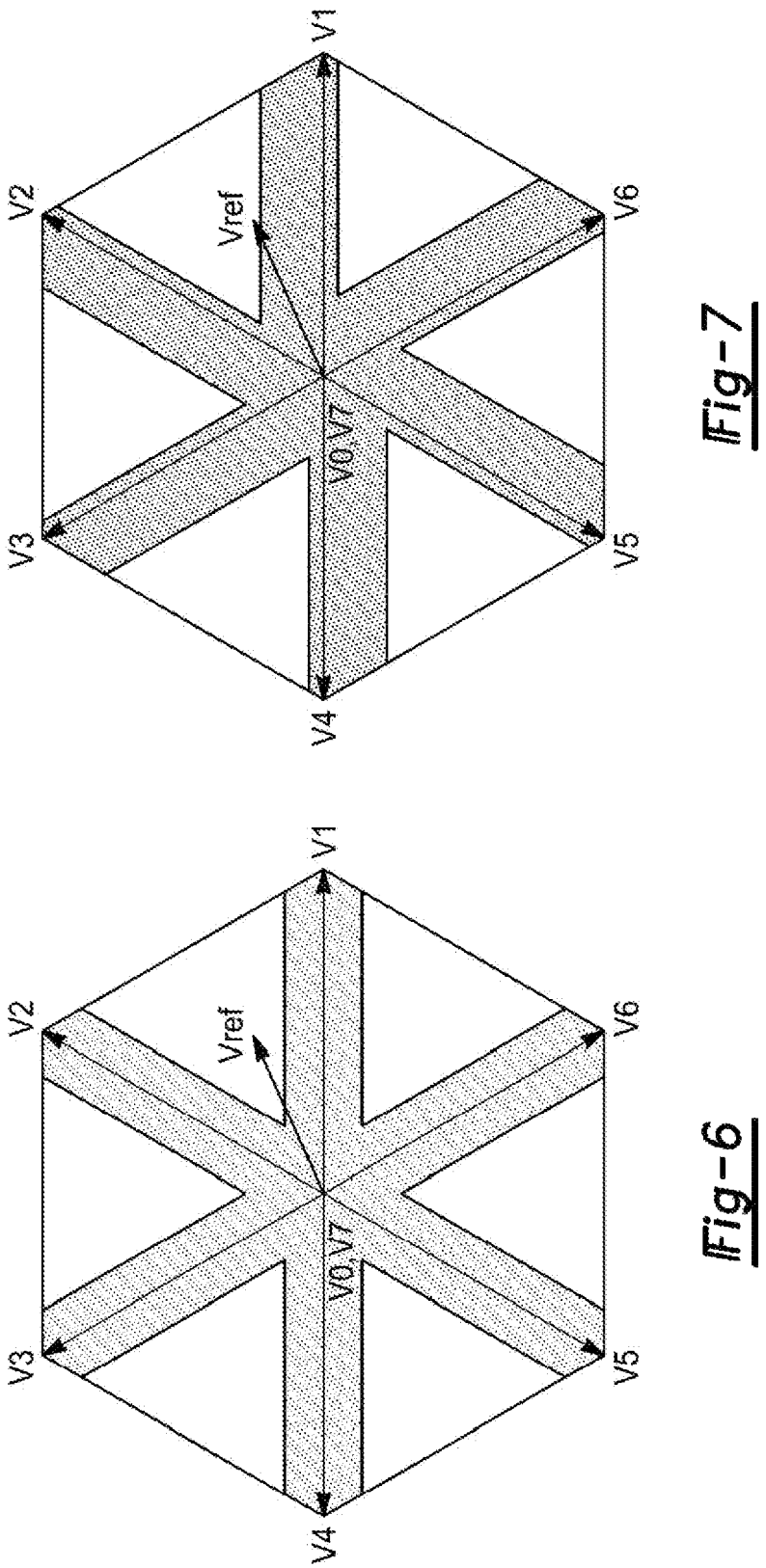
FIG. 6 illustrates the coincidental switching region surrounding each realizable voltage vector. A reference voltage in the shaded region will result in coincidental switching between two or three phases.
FIG. 7 illustrates the coincidental switching region that is altered by inverter pause time.

When the potential voltage vector is closely aligned with one of the realizable voltage vectors, the resultant sequence of realizable voltage vectors may lead to phase voltage switching events in close proximity. One such example is shown in FIGS. 4 and 5. This coincidental switching event can magnify the effect of the switching transients on the EMC. The region of reference voltage vectors that can result in coincidental switching can be shown graphically as in FIG. 6. The coincidental switching region surrounds the realizable vectors, and the size of the coincidental switching bands around these vectors is related to the proximity threshold of the coincidental switching, switching frequency, and the total DC voltage. If nonlinear factors such as inverter pause time are considered, the coincidental switching region can be altered but the coincidental switching events will still occur when the reference voltage falls in this skewed coincidental switching region as shown in FIG. 7.

Coincidental switching has been discovered to exacerbate the effect of switching transients on electromagnetic interference (EMI). This EMI can interfere with electronics, radio reception, and can add challenges to meeting standards. A new modulation strategy can reduce or completely remove any coincidental switching events, thus changing EMC performance. A possible key to such a strategy is to reduce the effect on the original intended voltage.

At a high level, the coincidental switching precluding strategy can be described as in FIG. 8. There are two main steps to this process. The first is identifying the voltage command and the operating conditions that will lead to coincidental switching events. This will include consideration of nonideal behaviors such as inverter pause time. The second step is the calculation of the duty cycle adjustment. This adjustment will be chosen to minimize the effect on the realization of the original voltage command.

At operations 22, 24 voltage commands and operating conditions are obtained. At decision block 26, it is determined whether a coincidental switching event will happen. If no, duty cycle commands are applied to the inverter at operation 28. If yes, a PWM modification algorithm is executed at operation 30. The algorithm then proceeds to operation 28.

The identification of a coincidental switching event is based on the prediction of switching times from the original duty cycle and a model of the inverter behavior. Multiple nonidealities can cause the true switching behavior to deviate from the original duty cycle command, but many of these nonidealities (such as propagation delays and switching transients) effect all phases equally and will not have an effect on the relative timing of phase switching events. Other nonidealities, particularly pause time, will need to be considered. Considering the original duty cycle dn, the switching period Ts, the current through the nth phase In, and the effect of turn-on-delay pause time insertion dt, the predicted switching time of the nth phase Tn, can be predicted with the equations below. It should be noted that the calculation depends on whether the carrier is high (a switching period starting with the lower switch in the 'on' position) or the carrier is low (a switching period starting with the upper switch in the 'on' position).

$$T_n = T_s \cdot (1 - d_n) + dt \cdot \text{sign}(-I_n), \text{ when the carrier is high}$$

$$T_n = T_s \cdot d_n + dt \cdot \text{sign}(I_n), \text{ when the carrier is low}$$

where:

$$\text{sign}(x) = \begin{vmatrix} 1 & \text{when } x > 0 \\ 0 & \text{when } x < 0 \end{vmatrix}$$

This calculation can be carried out for each phase after the calculation of the duty cycles. When the difference in switching time between any two phases is within a calibratable proximity threshold (the width of the threshold can be potentially based on switching transient dynamics), it indicates an impending coincidental switching event. When this occurs, the commanded voltage will be modified such that this coincidental switching event does not occur. The value of the proximity threshold can depend on application, and be determined via testing, simulation, etc.

There are many potential alterations of the commanded voltage, but they can be summarized with a few archetypes. These alterations will be shown in the voltage vector diagram for simplicity, but modification can also be applied to the duty cycles instead of the reference voltage vector given the known relationship between the voltage reference vector and duty cycle. The region near the V1 vector in FIG. 6 will be used for graphical examples, and the same logic would apply to the regions around the other realizable voltage vectors, as well as cases where inverter nonlinearities alter the coincidental switching regions as in FIG. 7.

Figures 9, 10, 11, 12, 13, 14:
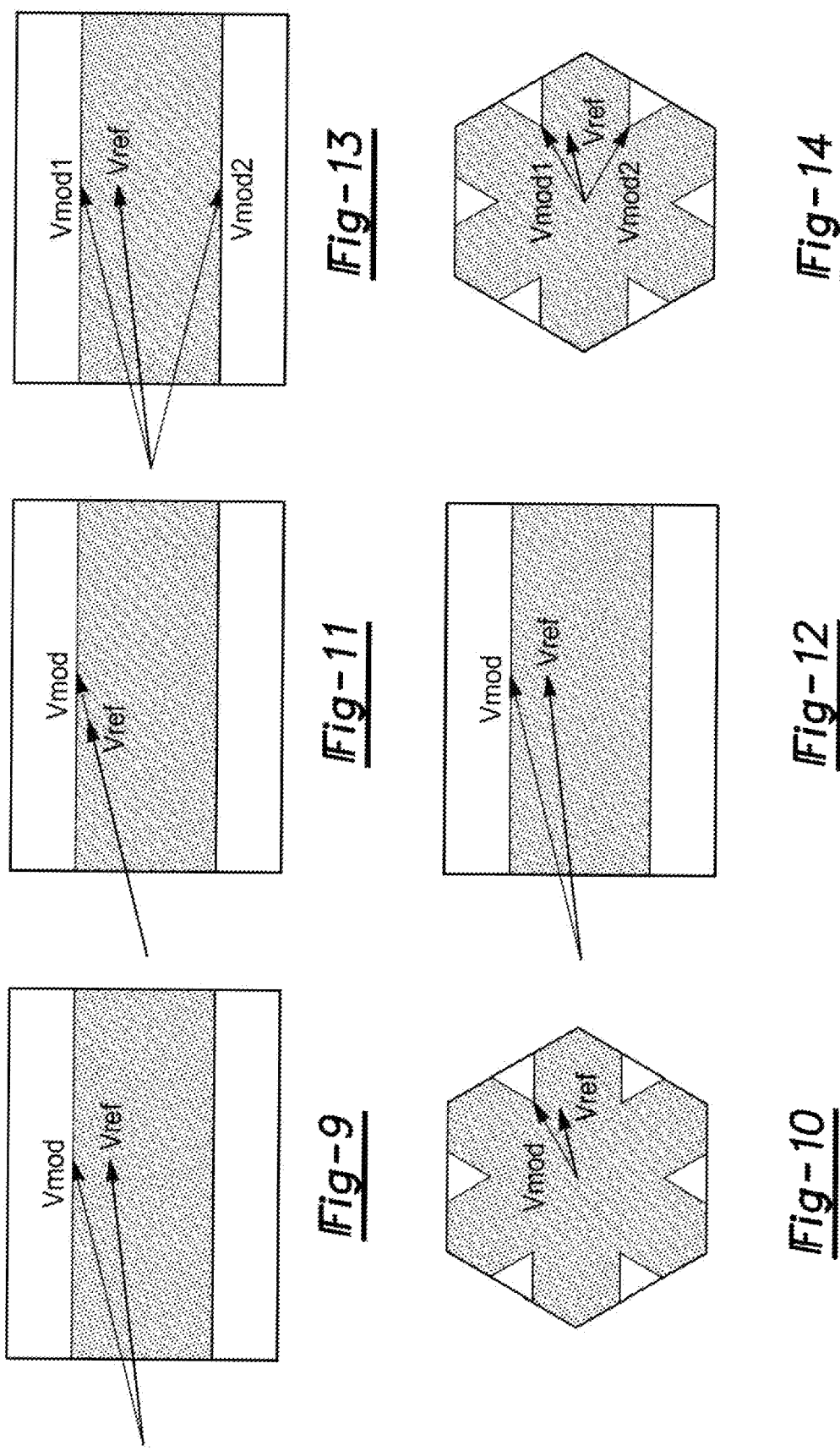
FIG. 9 illustrates a modification of the voltage vector that minimizes the distance of the alteration.
FIG. 10 illustrates a modification of the voltage vector with the closest vector in the non-shaded region if the reference voltage vector is small.
FIG. 11 illustrates a modification of the voltage vector that preserves the angle of the original reference voltage.
FIG. 12 illustrates a modification of the voltage vector that preserves the magnitude of the original reference voltage.
FIG. 13 illustrates a modification that consists of alternating between two different modified voltage vectors to balance out the average behavior during very low speed or stall conditions.
FIG. 14 illustrates a modification with two different modified voltage vectors if the reference voltage vector is small.

The first voltage command alteration would be based on minimizing the distance between the original voltage command and the modified voltage command as shown in FIGS. 9 and 10. In this case, the voltage vector Vref is moved to the closest possible position in the non-shaded region where coincidental switching will not occur. In FIG. 11, the voltage vector is extended to the permissible region to preserve the original voltage angle. In FIG. 12, the voltage vector is rotated to the nearest permissible region to preserve the original voltage magnitude.

More complex modifications of the voltage vector are possible as well. In the case of very low speed or stall conditions, multiple sequential voltage vectors may fall in a coincidental switching region. In this case, an algorithm that dithers between two different permissible region vectors may be employed to better balance out the average behavior as shown in FIGS. 13 and 14.

These are non-exhaustive examples of potential modifications of the original reference voltage vector. There are a number of objectives that need may need to be balanced, such as efficiency, output torque, and noise, vibration, and harshness. The balancing of these objectives will dictate the choice of modification method, and the choice may vary between operating points, voltage angles, or other key parameters. The key shared behavior of all of these methods is that reference voltage vectors that would result in coincidental switching events get modified such that the resulting switching behavior has no coincidental switching events.

These various PWM alteration schemes should be governed by higher-level vehicle control systems. The first level of control is the enabling/disabling of the PWM alteration method regardless of its specific implementation.

Figure 15:
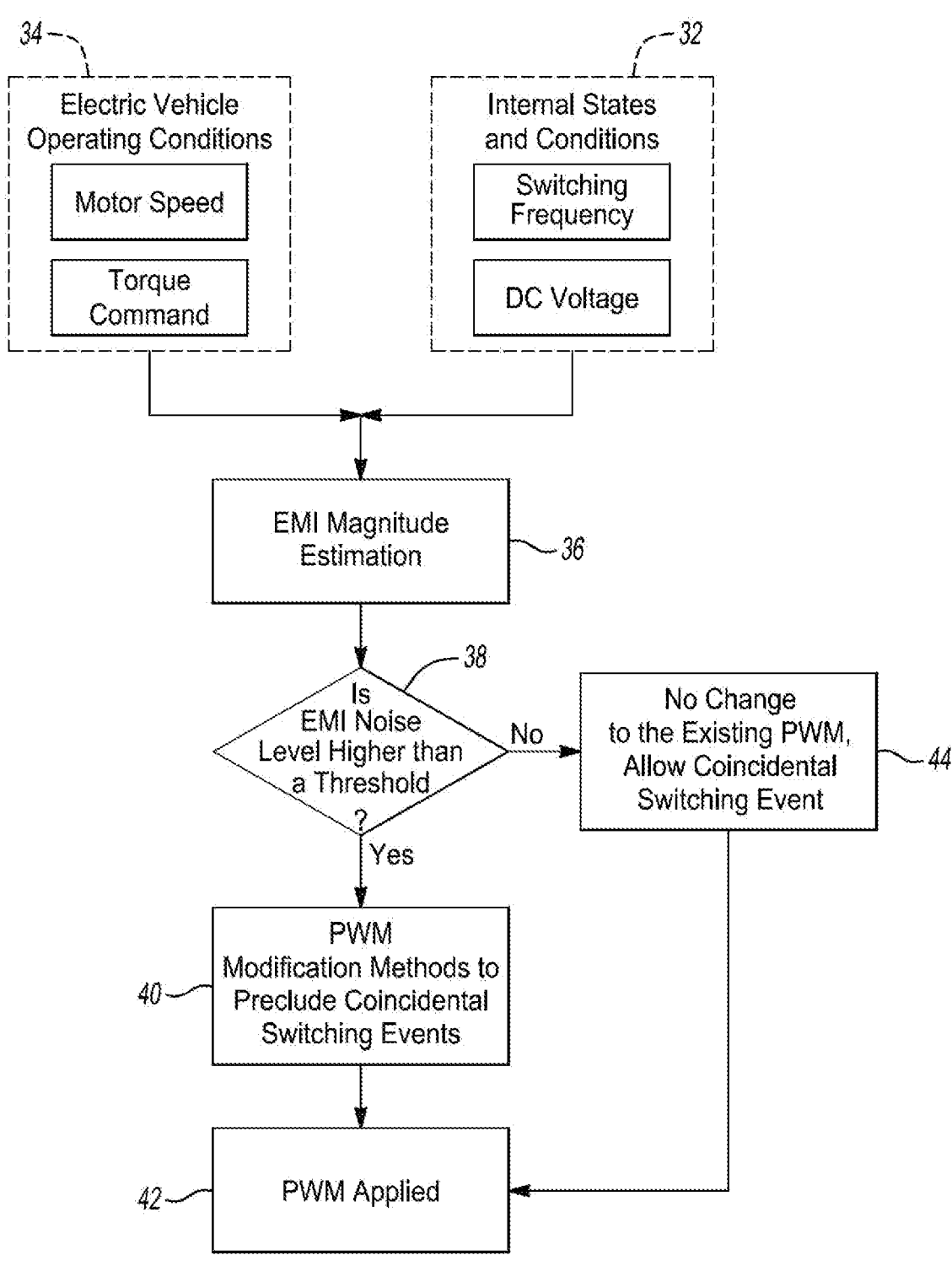
FIG. 15 is a flow chart of an algorithm for governing the execution of the coincidental switch precluding feature based on vehicle operation conditions as well as internal states and conditions such as the pulse width modulation (PWM) scheme and DC voltage level.

FIG. 15 shows how the vehicle system adopts the proposed PWM modification method. The electric drive system is a major noise source of EMI, and noise level is linked to the electric vehicle operating conditions, such as torque and speed, and the electric powertrain internal states and conditions, such as switching frequency and DC voltage. During vehicle calibration, if the EMI noise level is found to be higher than the allowed threshold in a certain condition, the PWM modification method is enabled. For example, if the vehicle is running in a test setting at low-speed low-torque conditions, it is likely that coincidental switching events may occur more frequently, which result in a high measured EMI noise level. The PWM modification will thus be enabled during regular operation while the vehicle is running in low-speed low torque conditions to preclude coincidental switching events and reduce expected EMI noise from the source. However, in the same torque and speed conditions, if the DC voltage is reduced because of the battery state of charge changes, it is possible the EMI noise level is acceptable. Then, there is no change to the existing PWM scheme, and coincidental switching events would be allowed. Through this mechanism, unnecessary PWM modifications can be precluded to reduce the distortion of the desired electric drive behavior.

At operations 32, 34, internal states and conditions and electric vehicle operating conditions are obtained. At operation 36, EMI magnitude estimation is performed using known techniques. At decision block 38, it is determined whether the EMI noise level is higher than a threshold, which can be selected via testing, simulation, etc. If yes, PWM modification methods are performed to preclude coincidental switching events at operation 40. At operation 42, PWM commands are applied to the inverter. If no, no PWM modification occurs at operation 44. The algorithm then proceeds to operation 42.

Figure 16:
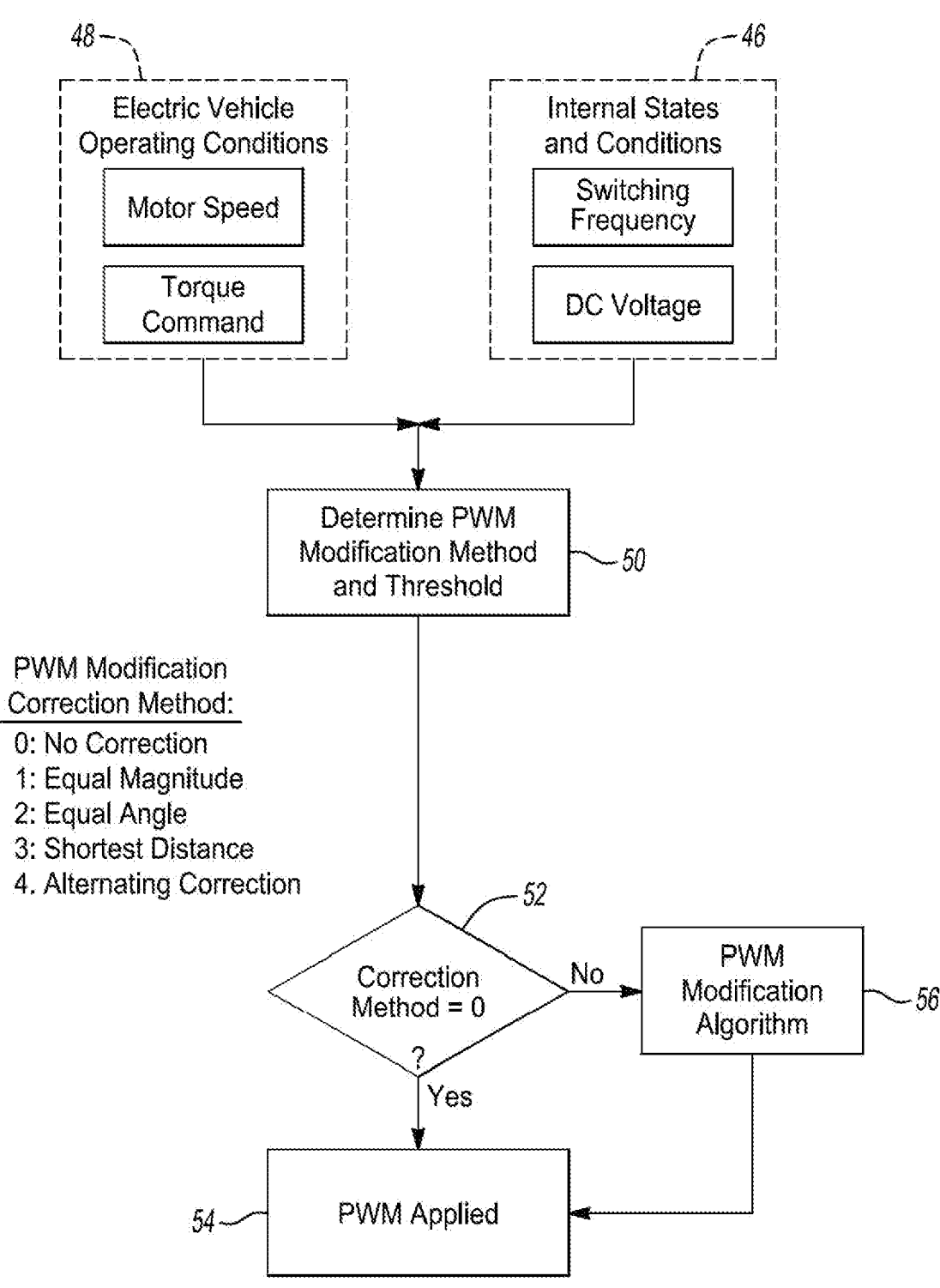
FIG. 16 is a flow chart of an algorithm showing a potential operating point dependent selection of PWM modification strategies including a "no correction" method at certain operating points that allows for coincidental switching.

This strategy can be expanded to allow for an operating point dependent choice of PWM alteration strategy as shown in FIG. 16. This method allows for a calibratable choice of PWM strategy modification method and a minimal allowed switching event proximity threshold based on operating point. In cases where the EMC is known to be nonproblematic, no modification is needed. In cases with very slow motor speed, the alternating correction method might be more appropriate. These are just examples, the calibration of the PWM correction method can be done to balance any number of outputs.

At operations 46, 48, internal states and conditions and electric vehicle operating conditions are obtained. At operation 50, the PWM modification method and threshold are determined. At decision block 52, it is determined whether no PWM correction is appropriate. If yes, PWM commands are applied to the inverter at operation 54. If no, PWM modification is performed at operation 56. The algorithm then proceeds to operation 54.

Figure 17:
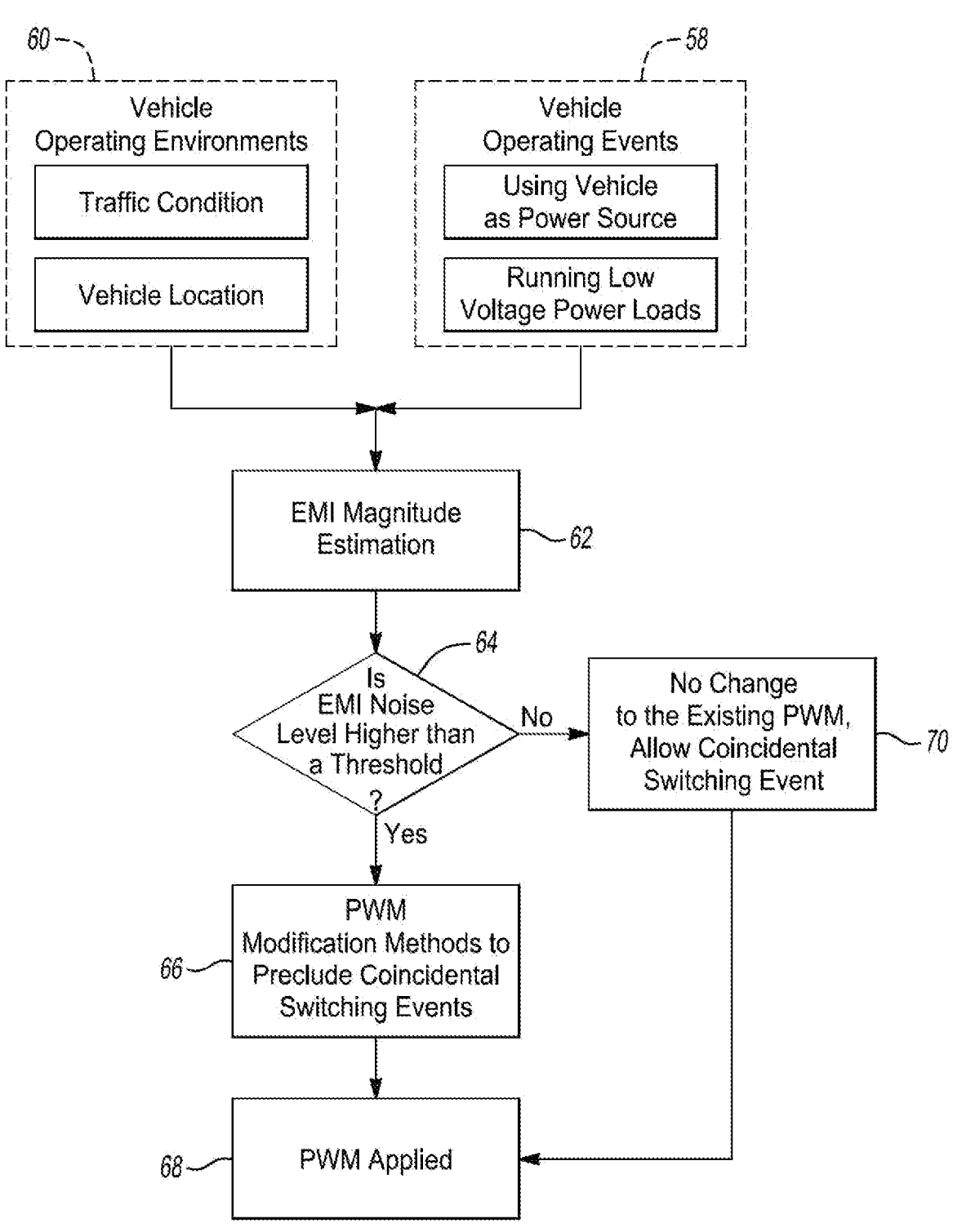
FIG. 17 is a flow chart of an algorithm for governing the execution of the coincidental switch precluding feature based on vehicle operating events and operating environments.

The proposed PWM modification method can be triggered by certain vehicle operating events and vehicle operating environments as well, as shown in FIG. 17. When an electrified vehicle is connected to a microgrid or used as a standalone power source, the inverter may still be engaged if an internal combustion engine is powering an electric generator. This operating mode may result in EMC challenges that can be changed by precluding coincidental switching. Running heavy low voltage power loads, such as an air conditioning compressor or 12V battery charger, can also add to the overall sum of EMI noise. In that case, the proposed PWM strategy modification can be enabled to lower the inverter's contribution to the EMI and keep the sum of all EMI noise down. If the vehicle is likely to be operating in high EMI environments, such as a traffic jam or a heavy traffic road with a large (predefined) number of electric vehicles in close proximity, or the vehicle is operated in an enclosed space (e.g., a garage, parking structure, etc.), the proposed strategies can be enabled to reduce EMI noise. When not in such environments, the proposed strategies need not be enabled. Operation of the vehicle in a parking lot or an open road, for example, need not require the proposed strategies to be enabled.

At operations 58, 60, vehicle operating events and vehicle operating environments are obtained. At operation 62, EMI magnitude estimation is performed. At decision block 64, it is determined whether the EMI noise level is higher than a threshold. If yes, PWM modification methods are performed to preclude coincidental switching events at operation 66. At operation 68, PWM commands are applied to the inverter. If no, no PWM modification occurs at operation 70. The algorithm then proceeds to operation 68.

The PWM modification scheme can be detected by measuring the inverter output voltage at a high sampling rate. Measurements of the motor speed, position, and phase voltages can be used to determine the underlying reference voltage vectors. Over a long enough collection window, it can be determined if certain regions are artificially precluded and if these regions correspond with identified patterns of coincidental switching regions. Furthermore, the manner in which the expected voltage is shifted away from a problematic region can also be detected through this test. Finally, EMC measurements can be taken using standard measurement methods. Presence of the proposed technology is indicated under the following circumstances: (1) Measured voltage vectors never fall within the problematic areas shown in the figures and are instead moved using some combination of the voltage alteration methods discussed; (2) The presence and form of this voltage alteration has a dependency on measured EMC performance; (3) The presence and form of this voltage alteration has a dependency on internal powertrain circumstances such as operating point, DC voltage, and/or switching frequency; or (4) The presence and form of this voltage alteration has a dependency on external circumstances such as other power loads in the vehicle, vehicle to infrastructure operating modes, localized traffic, and/or vehicle location. The positive detection of any of these circumstances will indicate the presence of the proposed technology.

Figure 18:
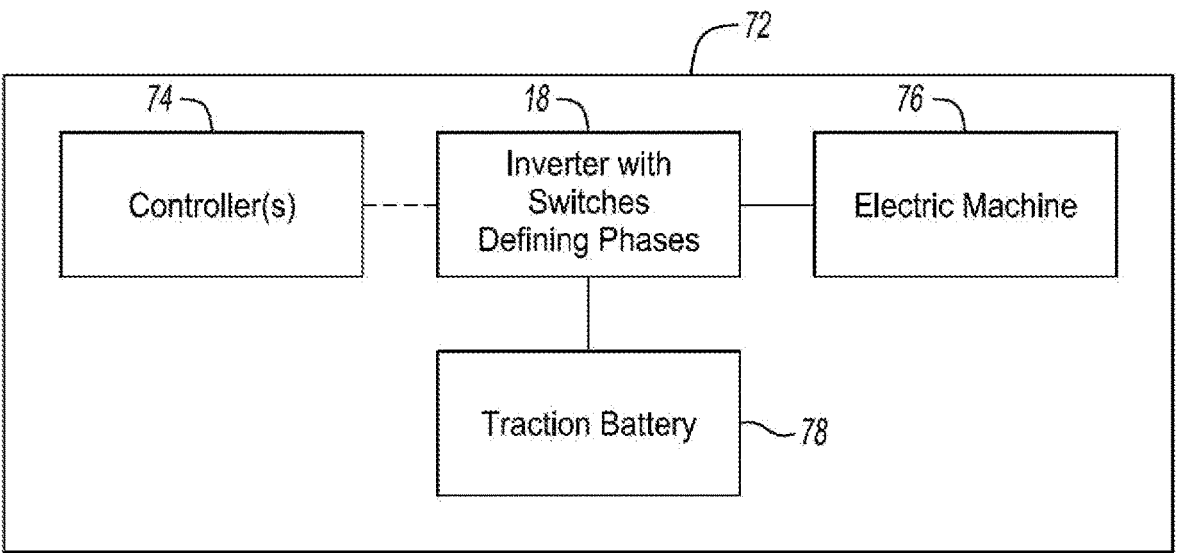
FIG. 18 is a block diagram of a vehicle.

Referring to FIG. 18, a vehicle 72 includes one or more controllers 74, and the inverter 18 with switches defining phases, an electric machine 76, and a traction battery 78. The one or more controllers 74 may perform the algorithms/control methods described herein.

Coincidental phase switching, i.e., the switching of multiple phase voltages at or near the same time, is known to exacerbate electromagnetic interference. This can disrupt electronics and add challenges to meeting electromagnetic standards. Methods have been developed to predict such coincidental switching events and then modify the underlying voltage command to preclude this behavior. Multiple examples of modification methods were shown. The vehicle-level implementation of this technology was shown in detail, including methods to control the presence and form of the voltage alteration based on internal and external vehicle circumstances. The presence of this technology can be inferred, in one example, through the measurement of the inverter voltage output waveform and EMC performance, along with the evaluation/control of other internal and external vehicle states and circumstances.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims.

The words used in the specification are words of description rather than limitation, and it is understood that various changes may be made without departing from the spirit and scope of these disclosed materials. The words controller and controllers, and variations thereof for example, may be interchanged.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. An automotive vehicle comprising:
an electric machine;
an inverter electrically connected with the electric machine;
and one or more controllers programmed to,
during presence of traffic, generate voltage reference vectors such that differences between switching times of any two phases of the inverter are always greater than a value, and
during absence of traffic, generate the voltage reference vectors such that the differences are sometimes greater than the value and other times less than the value.

2. The automotive vehicle of claim 1, wherein the one or more controllers are further programmed to, during operation of the vehicle in an enclosed space, generate the voltage reference vectors such that the differences are sometimes greater than the value and other times less than the value.

3. The automotive vehicle of claim 2, wherein the one or more controllers are further programmed to, during operation of the vehicle in a parking lot, generate the voltage reference vectors such that the differences are always greater than the value.

4. The automotive vehicle of claim 1, wherein the generating the voltage reference vectors such that the differences are sometimes greater than the value includes altering the voltage reference vectors.

5. The automotive vehicle of claim 4, wherein the altering includes preserving an angle of the voltage reference vectors.

6. The automotive vehicle of claim 4, wherein the altering includes preserving a magnitude of the voltage reference vectors.

* * * * *